US012698966B2

(12) United States Patent
Shimizu

(10) Patent No.: US 12,698,966 B2
(45) Date of Patent: Aug. 4, 2026

(54) VIBRATOR DEVICE

(71) Applicant: SEIKO EPSON CORPORATION, Tokyo (JP)

(72) Inventor: Norifumi Shimizu, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 292 days.

(21) Appl. No.: 18/419,614

(22) Filed: Jan. 23, 2024

(65) Prior Publication Data

US 2024/0247935 A1 Jul. 25, 2024

(30) Foreign Application Priority Data

Jan. 24, 2023 (JP) ................................. 2023-008587

(51) Int. Cl.
| | |
|---|---|
| *G01C 19/56* | (2012.01) |
| *H03H 9/05* | (2006.01) |
| *H03H 9/10* | (2006.01) |
| *H03H 9/215* | (2006.01) |
| *H10W 72/20* | (2026.01) |
| *G01C 19/5607* | (2012.01) |
| *G01C 19/5642* | (2012.01) |

(52) U.S. Cl.
CPC ........... *G01C 19/56* (2013.01); *H03H 9/0557* (2013.01); *H03H 9/1014* (2013.01); *H03H 9/215* (2013.01); *H10W 72/227* (2026.01); *G01C 19/5607* (2013.01); *G01C 19/5642* (2013.01)

(58) Field of Classification Search
CPC ................ G01C 19/56; G01C 19/5642; G01C 19/5649; G01C 19/5656; G01C 19/5663; G01C 19/5783; H10W 72/221; H10W 72/227; H10W 72/228
See application file for complete search history.

(56) References Cited

U.S. PATENT DOCUMENTS

| | | | | |
|---|---|---|---|---|
| 5,751,065 A * | 5/1998 | Chittipeddi | ........... | H10P 74/277 257/773 |
| 6,495,915 B1 * | 12/2002 | Hsieh | ...................... | H01L 23/66 257/691 |
| 7,378,780 B2 * | 5/2008 | Mizumura | ........... | H03H 9/1021 310/341 |
| 7,683,483 B2 * | 3/2010 | Secareanu | ............. | H10W 72/20 257/737 |
| 8,026,588 B2 * | 9/2011 | Lee | ..................... | H10W 72/019 438/665 |

(Continued)

FOREIGN PATENT DOCUMENTS

JP 2021-148435 A 9/2021

*Primary Examiner* — Herbert K Roberts
(74) *Attorney, Agent, or Firm* — Harness, Dickey & Pierce, P.L.C.

(57) ABSTRACT

A vibrator device includes a vibration element, a circuit element configured to drive the vibration element, and a package that accommodates the vibration element and the circuit element. The package includes a mounting surface having a rectangular shape in a plan view and a plurality of external terminals arranged at the mounting surface, the plurality of external terminals include a corner terminal disposed at a corner of the mounting surface and a side terminal disposed at a side of the mounting surface, and an area of the corner terminal is larger than an area of the side terminal.

8 Claims, 4 Drawing Sheets

(56)        References Cited

U.S. PATENT DOCUMENTS

|  |  |  |  |
|---|---|---|---|
| 8,120,152 B2 * | 2/2012 | Chang Chien | ...... H01L 21/4832 |
|  |  |  | 257/676 |
| 8,501,612 B2 * | 8/2013 | Moran | ................. H10W 72/20 |
|  |  |  | 257/690 |
| 11,287,260 B2 * | 3/2022 | Oshio | ................ G01C 19/5663 |
| 2005/0184625 A1 * | 8/2005 | Miyazaki | ............. H03H 9/0542 |
|  |  |  | 310/348 |
| 2007/0170525 A1 * | 7/2007 | Eskridge | ............... B81B 7/0048 |
|  |  |  | 257/404 |
| 2016/0155927 A1 * | 6/2016 | Kabasawa | .......... G01C 19/5783 |
|  |  |  | 257/419 |
| 2018/0269850 A1 * | 9/2018 | Ito | ....................... H03H 9/02984 |
| 2020/0298350 A1 * | 9/2020 | Kurita | .................... B23K 35/40 |
| 2021/0033395 A1 * | 2/2021 | Ogura | ............... G01C 19/5656 |
| 2021/0231438 A1 * | 7/2021 | Ogura | ............... G01C 19/5628 |
| 2021/0288629 A1 | 9/2021 | Usuda |  |
| 2021/0336599 A1 * | 10/2021 | Yamashita | ......... H03H 9/02102 |

* cited by examiner

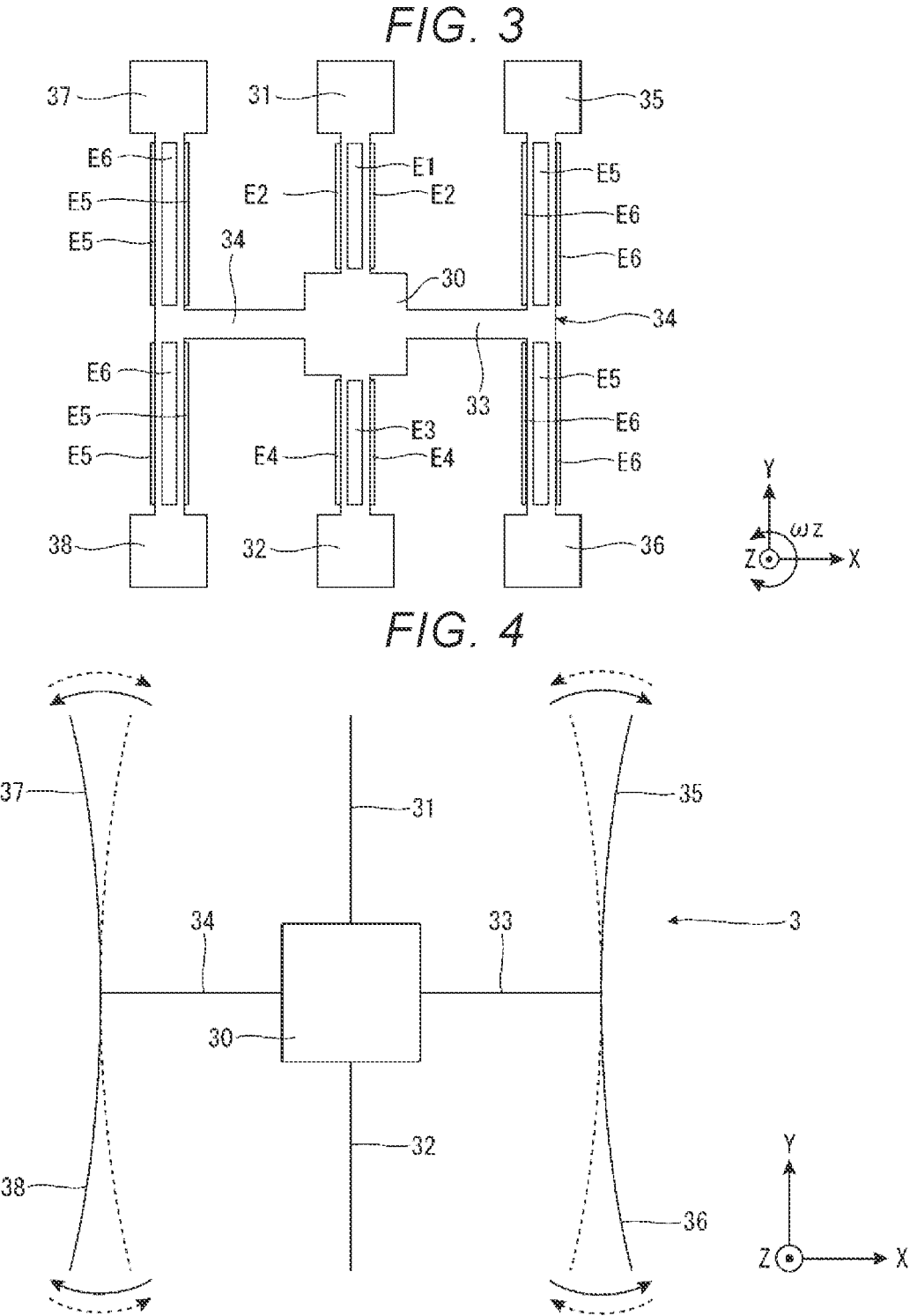

*FIG. 5*

VIBRATOR DEVICE

The present application is based on, and claims priority from JP Application Serial Number 2023-008587, filed Jan. 24, 2023, the disclosure of which is hereby incorporated by reference herein in its entirety.

BACKGROUND

1. Technical Field

The present disclosure relates to a vibrator device.

2. Related Art

A real-time clock device disclosed in JP-A-2021-148435 includes a package that accommodates a vibration element, an oscillation circuit, a timer circuit, and a functional circuit. At a lower surface of the package, a total of ten external terminals are arranged, that is, five external terminals arranged along one side of the package and five external terminals arranged along one side opposite to the one side. Then, additional functions other than a power supply, ground (GND), and an interface (IF) are assigned to four external terminals located at four corners of the package.

Such a real-time clock device is mounted on a mounting substrate by reflow soldering, and each external terminal is electrically coupled to the mounting substrate. In a mounted state, a thermal stress is generated in the package due to a difference in linear expansion coefficient between the package and the mounting substrate, and the thermal stress may cause a crack in solder and a conduction failure of the solder may occur. The thermal stress increases as a distance from a center of the package increases.

Therefore, in JP-A-2021-148435, as described above, additional functions are assigned to the external terminals arranged at the four corners of the package (locations farthest from the center), and main functions such as power supply, ground (GND), and an interface (IF) are assigned to the other external terminals. Accordingly, a possibility that the real-time clock device can function as a real-time clock device is increased even when a conduction failure of the solder occurs.

JP-A-2021-148435 is an example of the related art.

SUMMARY

However, according to JP-A-2021-148435, there is a problem that the conduction failure of the solder cannot be prevented.

A vibrator device according to the disclosure includes: a vibration element; a circuit element configured to drive the vibration element; and a package that accommodates the vibration element and the circuit element. The package includes a mounting surface having a rectangular shape in a plan view and a plurality of external terminals arranged at the mounting surface, the plurality of external terminals include a corner terminal disposed at a corner of the mounting surface and a side terminal disposed at a side of the mounting surface, and an area of the corner terminal is larger than an area of the side terminal.

BRIEF DESCRIPTION OF THE DRAWINGS

FIG. 3 is a top view illustrating an angular velocity detection element.

FIG. 4 is a schematic diagram illustrating a drive vibration mode of the angular velocity detection element.

FIG. 5 is a schematic diagram illustrating a detection vibration mode of the angular velocity detection element.

DESCRIPTION OF EMBODIMENTS

Hereinafter, a vibrator device according to an embodiment of the disclosure will be described in detail with reference to the accompanying drawings. For the convenience of description, three axes orthogonal to one another are shown as an X axis, a Y axis, and a Z axis. A direction along the X axis is also referred to as an "X-axis direction", a direction along the Y axis is also referred to as a "Y-axis direction", and a direction along the Z axis is also referred to as a "Z-axis direction". The Z axis is along a vertical direction, an arrow side thereof is referred to as "upper", and an opposite side is referred to as "lower". Hereinafter, a plan view from the Z-axis direction is also simply referred to as a "plan view".

Figure 1:
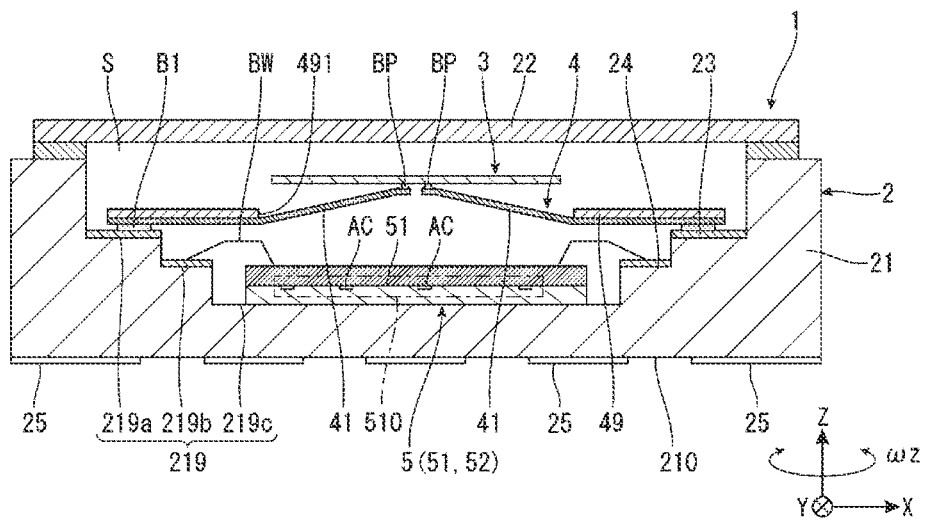
FIG. 1 is a cross-sectional view of a vibrator device according to a preferred embodiment.
Figure 2:
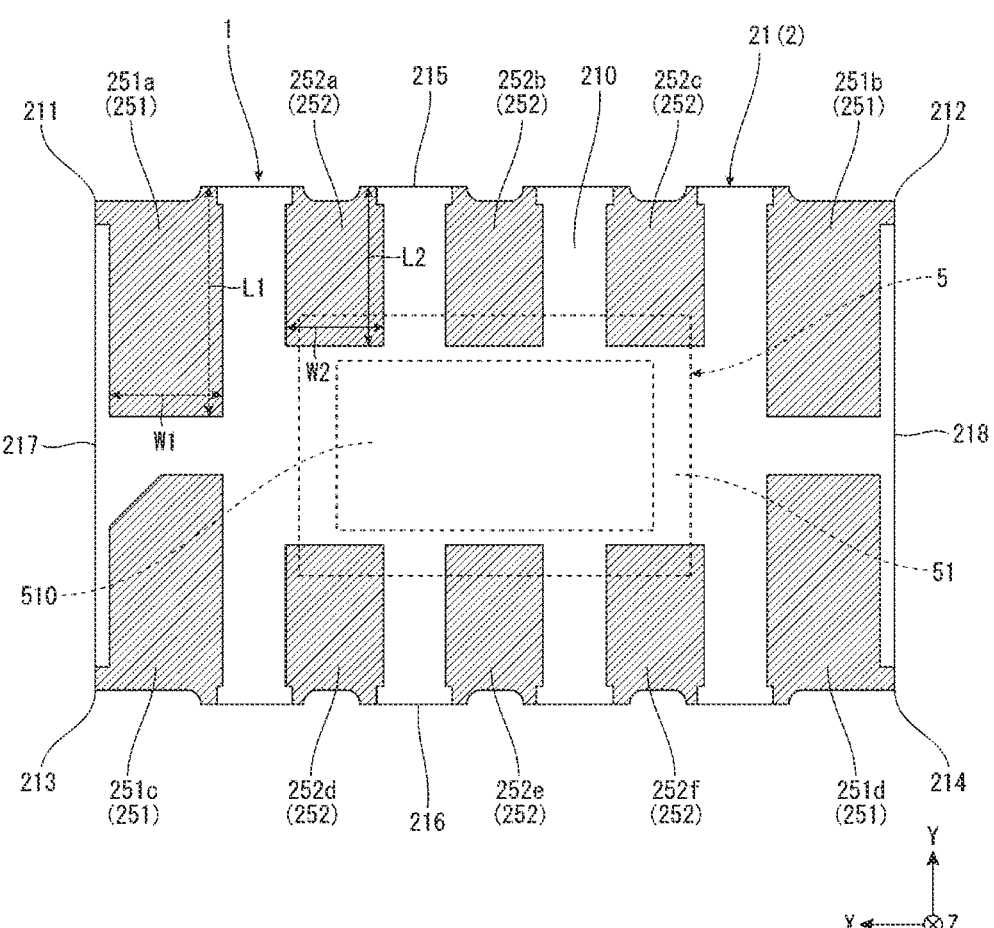
FIG. 2 is a bottom view of the vibrator device.
Figure 5:
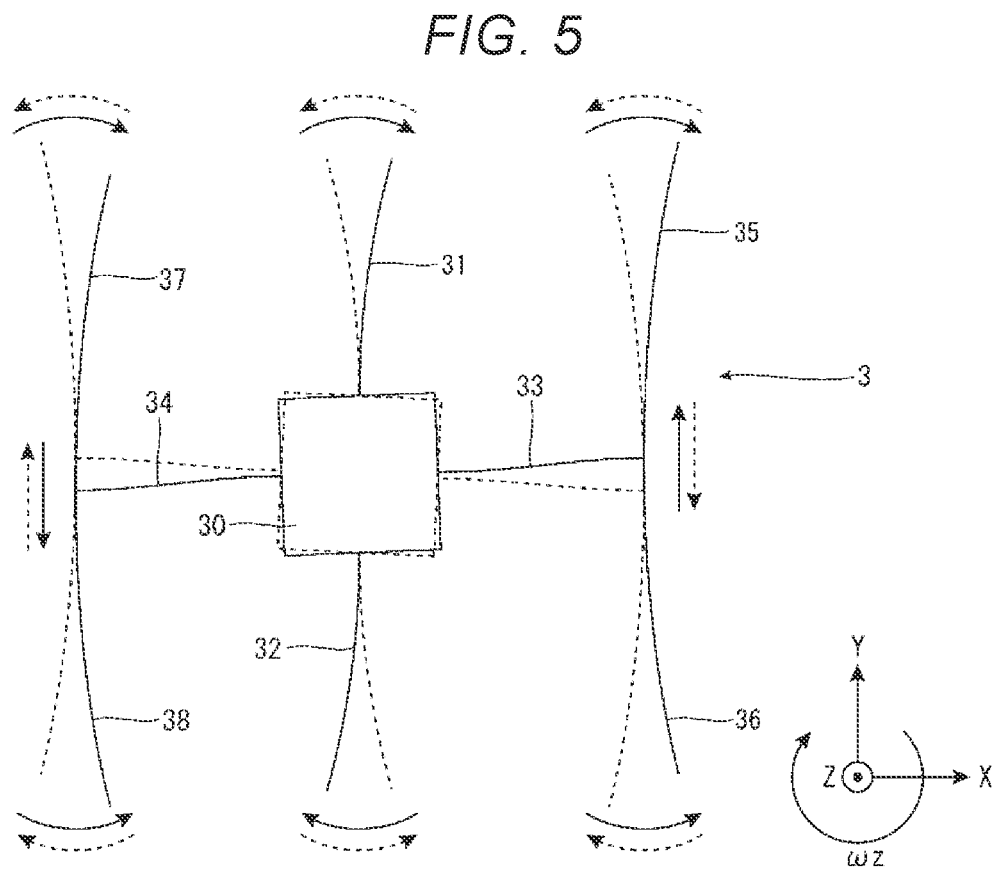
Figure 6:
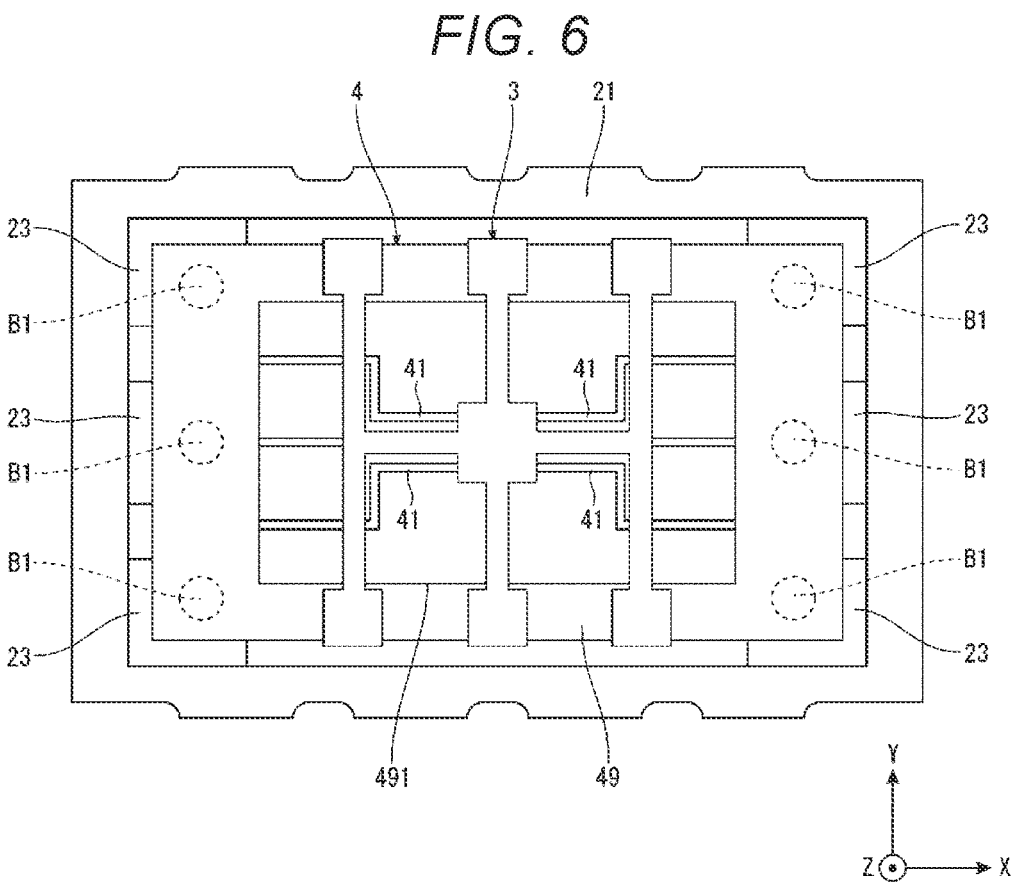
FIG. 6 is a top view of a support substrate.
Figure 7:
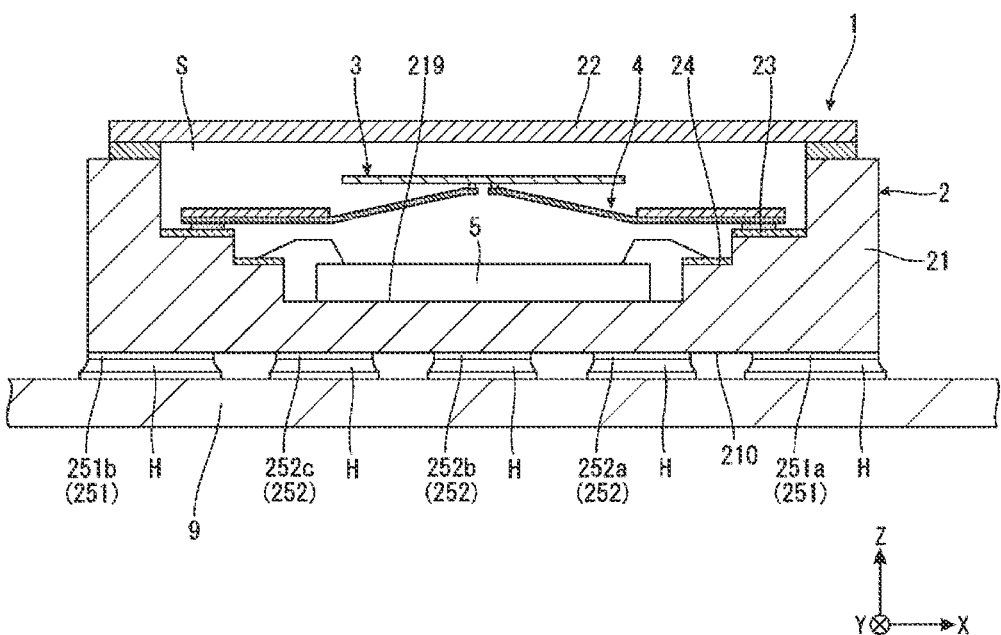
FIG. 7 is a cross-sectional view illustrating a mounted state of the vibrator device.

FIG. 1 is a cross-sectional view of a vibrator device according to a preferred embodiment. FIG. 2 is a bottom view of the vibrator device. FIG. 3 is a top view illustrating an angular velocity detection element. FIG. 4 is a schematic diagram illustrating a drive vibration mode of the angular velocity detection element. FIG. 5 is a schematic diagram illustrating a detection vibration mode of the angular velocity detection element. FIG. 6 is a top view of a support substrate. FIG. 7 is a cross-sectional view illustrating a mounted state of the vibrator device.

A vibrator device 1 illustrated in FIG. 1 is an angular velocity sensor configured to detect an angular velocity ωz around the Z axis, and includes an angular velocity detection element 3 serving as a vibration element to which the angular velocity ωz is applied, a support substrate 4 supporting the angular velocity detection element 3, a circuit element 5 electrically coupled to the angular velocity detection element 3, and a package 2 that accommodates these components.

Package 2

As illustrated in FIG. 1, the package 2 includes a cavity-like base 21 having a recess 219 opened in an upper surface thereof, and a plate-shaped lid 22 bonded to the upper surface of the base 21 and closing an opening of the recess 219. The package 2 has an internal space S, and the angular velocity detection element 3, the support substrate 4, and the circuit element 5 are accommodated in the internal space S in a manner of overlapping one another in the Z-axis direction. The internal space S is hermetically sealed, is in a depressurized state, and is preferably in a state closer to vacuum. Accordingly, a viscous resistance is reduced, and the angular velocity detection element 3 can be efficiently driven.

A constituent material of the base 21 is not particularly limited, and for example, various ceramics such as aluminum oxide can be used. A constituent material of the lid 22 is not particularly limited, and the lid 22 may be a member having a linear expansion coefficient similar to that of the constituent material of the base 21. For example, when the constituent material of the base 21 is ceramics, the lid 22 is preferably made of an alloy such as Kovar. A method of bonding the base 21 and the lid 22 is not particularly limited, and for example, the base 21 and the lid 22 may be bonded via a metallization layer, or may be bonded via an adhesive.

The recess 219 includes a first recess 219*a* that opens on the upper surface of the base 21, a second recess 219*b* that opens on a bottom surface of the first recess 219*a* and has an opening area smaller than that of the first recess 219*a*, and a third recess 219*c* that opens on a bottom surface of the second recess 219*b* and has an opening area smaller than that of the second recess 219*b*. The circuit element 5 is fixed at a bottom surface of the third recess 219*c*, the support substrate 4 is fixed at the bottom surface of the first recess 219*a*, and the angular velocity detection element 3 is fixed at the support substrate 4.

A plurality of internal terminals 23 are disposed at the bottom surface of the first recess 219*a*, a plurality of internal terminals 24 are disposed at the bottom surface of the second recess 219*b*, and a plurality of external terminals 25 are disposed at a mounting surface 210 that is a bottom surface of the base 21. The plurality of internal terminals 24 include terminals electrically coupled to the internal terminal 23 via an internal wiring (not shown) formed in the base 21 and terminals electrically coupled to the external terminal 25 via the internal wiring. The internal terminals 23 are electrically coupled to the support substrate 4 via conductive bonding members B1, and the internal terminals 24 are electrically coupled to the circuit element 5 via bonding wires BW. The number and arrangement of the internal terminals 23 and 24 and the external terminal 25 are not particularly limited, and may be appropriately set according to the number of terminals of the angular velocity detection element 3 and the circuit element 5, for example.

As illustrated in FIG. 2, the mounting surface 210, which is the bottom surface of the base 21, has a rectangular shape, in particular, an oblong shape elongated in the X-axis direction in the plan view. Therefore, the mounting surface 210 has four corners and four sides connecting the corners. The term "rectangular shape" means a shape that does not coincide with the rectangular shape due to formation of a cutout (a cutout for forming castellation) in a corner or a side as in the embodiment but can be viewed as being the same as the rectangular shape as a whole, in addition to a shape that coincides with the rectangular shape.

The four corners include a first corner 211, a second corner 212, a third corner 213, and a fourth corner 214. The four sides include a first side 215 and a second side 216 that face each other and extend in the X-axis direction, and a third side 217 and a fourth side 218 that face each other and extend in the Y-axis direction. The first side 215 is located between the first corner 211 and the second corner 212, the second side 216 is located between the third corner 213 and the fourth corner 214, the third side 217 is located between the first corner 211 and the third corner 213, and the fourth side 218 is located between the second corner 212 and the fourth corner 214.

Ten external terminals 25 are disposed at the mounting surface 210. The ten external terminals 25 include four corner terminals 251 disposed at the corners of the mounting surface 210 and six side terminals 252 disposed at the sides of the mounting surface 210.

The four corner terminals 251 include a first corner terminal 251*a* disposed at the first corner 211, a second corner terminal 251*b* disposed at the second corner 212, a third corner terminal 251*c* disposed at the third corner 213, and a fourth corner terminal 251*d* disposed at the fourth corner 214.

The six side terminals 252 include three first side terminals 252*a*, 252*b*, and 252*c* arranged side by side in the X-axis direction along the first side 215, and three second side terminals 252*d*, 252*e*, and 252*f* arranged side by side in the X-axis direction along the second side 216.

Each of the ten external terminals 25 extends along the third and fourth sides 217 and 218, that is, along the Y-axis direction. Each of the external terminals 25 has a castellation extending on a side surface of the base 21.

The vibrator device 1 is characterized by the configuration of the ten external terminals 25, which will be described in detail later.

Angular Velocity Detection Element 3

The angular velocity detection element 3 is a quartz crystal vibration element formed of a quartz crystal substrate. As illustrated in FIG. 3, the angular velocity detection element 3 includes a base portion 30 located in a central portion, a pair of detection vibration arms 31 and 32 extending from the base portion 30 to both sides in the Y-axis direction, a pair of support arms 33 and 34 extending from the base portion 30 to both sides in the X-axis direction, a pair of drive vibration arms 35 and 36 extending from a tip end portion of one support arm 33 to both sides in the Y-axis direction, and a pair of drive vibration arms 37 and 38 extending from a tip end portion of the other support arm 34 to both sides in the Y-axis direction. The angular velocity detection element 3 is supported by the support substrate 4 at the base portion 30.

The angular velocity detection element 3 includes, as electrodes, first detection signal electrodes E1 disposed on both main surfaces of the detection vibration arm 31, first detection ground electrodes E2 disposed on both side surfaces of the detection vibration arm 31, second detection signal electrodes E3 disposed on both main surfaces of the detection vibration arm 32, second detection ground electrodes E4 disposed on both side surfaces of the detection vibration arm 32, drive signal electrodes E5 disposed on both main surfaces of the drive vibration arms 35 and 36 and both side surfaces of the drive vibration arms 37 and 38, and drive ground electrodes E6 disposed on both side surfaces of the drive vibration arms 35 and 36 and both main surfaces of the drive vibration arms 37 and 38.

The angular velocity detection element 3 as described above detects the angular velocity ωz as follows. When a drive signal is applied to between the drive signal electrode E5 and the drive ground electrode E6, as illustrated in FIG. 4, the drive vibration arms 35 and 36 and the drive vibration arms 37 and 38 perform flexural vibration in opposite phases along an X-Y plane (hereinafter, this state is also referred to as a "drive vibration mode"). In this state, the vibration of the drive vibration arms 35, 36, 37, and 38 is canceled out, and the detection vibration arms 31 and 32 do not vibrate substantially. When the angular velocity ωz is applied to the angular velocity detection element 3 in a state in which the angular velocity detection element 3 is driven in the drive vibration mode, as illustrated in FIG. 5, Coriolis force acts on the drive vibration arms 35, 36, 37, and 38 to excite flexural vibration in the Y-axis direction, and in response to such flexural vibration, the detection vibration arms 31 and 32 perform the flexural vibration in the X-axis direction (hereinafter, this state is also referred to as a "detection vibration mode").

Electric charges generated in the detection vibration arm 31 by such a detection vibration mode are taken out as a first output signal from the first detection signal electrode E1, electric charges generated in the detection vibration arm 32 are taken out as a second output signal from the second detection signal electrode E3, and the angular velocity ωz is obtained based on the first and second output signals.

Support Substrate 4

As illustrated in FIG. 1, the support substrate 4 is fixed at the bottom surface of the first recess 219*a* by the bonding member B1. The support substrate 4 is located below the angular velocity detection element 3 and supports the angular velocity detection element 3 in a manner of lifting the angular velocity detection element 3 from below. The support substrate 4 is a substrate for tape automated bonding (TAB) mounting, and as illustrated in FIG. 6, includes a plate-shaped substrate 49 having an opening 491 and six leads 41 supported by the substrate 49. The substrate 49 is made of, for example, a flexible resin such as polyimide, and each lead 41 is made of, for example, copper foil.

Each lead 41 is electrically coupled to the corresponding internal terminal 23 via the bonding member B1. In the plan view, a tip end portion of each lead 41 extends into the opening 491. Further, as illustrated in FIG. 1, each lead 41 is bent and inclined in the middle, and the tip end portion thereof passes through the opening 491 and is located above the substrate 49. The base portion 30 of the angular velocity detection element 3 is fixed at the tip end portions of the leads 41 via electrode bumps BP, and the leads 41 are electrically coupled to the electrodes E1 to E6.

Circuit Element 5

As illustrated in FIG. 1, the circuit element 5 is fixed at the bottom surface of the third recess 219*c*. The circuit element 5 mainly includes a drive circuit configured to apply a drive signal to drive the angular velocity detection element 3, and a detection circuit configured to detect the angular velocity ωz based on the first and second output signals from the angular velocity detection element 3. The circuit element 5 includes an active surface 51, and an active element AC such as a transistor provided in the drive circuit or the detection circuit is formed at the active surface 51. Hereinafter, a region of the active surface 51 where the active element AC is formed is also referred to as an active element formation region 510.

The configuration of the vibrator device 1 is described above. For example, as illustrated in FIG. 7, the vibrator device 1 is mounted at a mounting substrate 9 via solder H by reflow soldering. In a state where the vibrator device 1 is mounted at the mounting substrate 9, each external terminal 25 is electrically coupled to a corresponding terminal on the mounting substrate 9 via the solder H.

Here, in the mounted state where the vibrator device 1 is mounted on the mounting substrate 9, a thermal stress is generated in the base 21 due to a difference in linear expansion coefficient between the base 21 and the mounting substrate 9, and the thermal stress may cause a crack in the solder H and a conduction failure of the solder H may occur. The thermal stress increases as a distance from a center of the mounting surface 210 increases. That is, among the ten external terminals 25, the solder H corresponding to the corner terminals 251 located at the four corners of the mounting surface 210 receives a large thermal stress, and a crack is likely to occur in the solder H.

Therefore, in the vibrator device 1 of the embodiment, as illustrated in FIG. 2, an area of each corner terminal 251 is larger than an area of each side terminal 252. Accordingly, the solder H corresponding to the corner terminal 251 can be formed larger. By forming the solder H to be large, strength of the solder H can be increased, and a crack is less likely to occur in the solder H. In addition, even if a crack or the like occurs in the solder H due to the thermal stress, since the solder H is large, the crack is less likely to spread over the whole solder H, and the corner terminal 251 and the mounting substrate 9 are less likely to be opened (electrically isolated). That is, it is possible to effectively prevent a conduction failure of the solder H. Therefore, a possibility of maintaining a good electrical coupling state between each corner terminal 251 and the mounting substrate 9 increases, and reliability of the mounting substrate 9 increases.

In particular, it is possible to prevent an excessive increase in size of the mounting surface 210 by forming only the corner terminals 251, which are likely to receive a thermal stress, to be large among the ten external terminals 25 as in the embodiment. Further, it is easy to secure a wide region, where the external terminal 25 is not formed, in a central portion of the mounting surface 210, and as will be described later, it is easy to dispose the circuit element 5 such that the active element formation region 510 does not overlap the external terminal 25 in the plan view.

The area of each corner terminal 251 is not particularly limited, and is preferably 1.2 times or more and more preferably 1.5 times or more the area of each side terminal 252. Accordingly, the above-described effect is more remarkable.

When a length of each corner terminal 251 along the third side 217 (a length along the Y-axis direction) is set as L1 and a length of each side terminal 252 along the third side 217 (a length along the Y-axis direction) is set as L2, L1 is larger than L2. That is, L1>L2. When a length of each corner terminal 251 along the first side 215, that is, a length along the X-axis direction is set as W1 and a length of each side terminal 252 along the first side 215, that is, a length along the X-axis direction is set as W2, W1 is larger than W2. That is, W1>W2.

Thus, by setting L1>L2 and W1>W2, the area of each corner terminal 251 can be made larger than the area of each side terminal 252 with a simple configuration. In particular, by setting L1>L2, a wide region where the external terminal 25 is not formed can be formed in the central portion of the mounting surface 210, and as will be described later, the circuit element 5 can be easily disposed such that the active element formation region 510 does not overlap the external terminal 25 in the plan view.

However, the shape of each corner terminal 251 is not particularly limited as long as the corner terminal 251 has an area larger than that of each side terminal 252.

As illustrated in FIG. 2, in the vibrator device 1, the active element formation region 510 does not overlap the external terminal 25 in the plan view. Accordingly, the thermal stress is less likely to be applied to the active element formation region 510. Therefore, in an active element formed in the active element formation region 510, particularly in a transistor, variation in inter-electrode distance due to the thermal stress is effectively prevented, and an output change can be effectively prevented. Therefore, the vibrator device 1 has high reliability.

As illustrated in FIG. 2, at least a part of a region of the circuit element 5 that is not the active element formation region 510, specifically, a region located around the active element formation region 510 overlaps the external terminal 25 in the plan view. Accordingly, a reduction in size of the vibrator device 1 can be achieved.

However, the arrangement of the circuit element 5 is not particularly limited, and for example, the active element formation region 510 may overlap the external terminal 25 in the plan view. The active surface 51 may not overlap the external terminal 25 in the plan view.

Although not shown, the ten external terminals 25 include, for example, a VDDM terminal serving as a power supply voltage application terminal, a VDDI terminal serving as an interface power supply voltage application terminal, a VDDL terminal serving as an internal regulator voltage output terminal coupled to a bypass capacitor, a GND terminal coupled to the ground, an SOMI terminal for communication, an SCLK terminal for a clock, a TEST terminal for adjustment and inspection, and a non-connection terminal (NC terminal) through which no signal is exchanged.

Among the various terminals, a terminal having an additional function, that is, a terminal without which a function of the vibrator device 1 can still be exhibited, specifically, the TEST terminal, the NC terminal, or the like is allocated as the corner terminal 251, and a terminal having a main function, specifically, the VDDM terminal, the VDDI terminal, the VDDL terminal, the GND terminal, the SOMI terminal, the SCLK terminal, or the like is allocated as the side terminal 252. Accordingly, the reliability of the vibrator device 1 is further improved.

The external terminal 25 is described above. However, the number and arrangement of the external terminals 25 are not particularly limited as long as the area of the corner terminal 251 is larger than the area of the side terminal 252.

The vibrator device 1 is described above. As described above, the vibrator device 1 includes the angular velocity detection element 3 that is a vibration element, the circuit element 5 configured to drive the angular velocity detection element 3, and the package 2 that accommodates the angular velocity detection element 3 and the circuit element 5. The package 2 includes the mounting surface 210 having a rectangular shape in a plan view and the plurality of external terminals 25 disposed at the mounting surface 210. In addition, the plurality of external terminals 25 include the corner terminals 251 disposed at the corners of the mounting surface 210 and the side terminals 252 disposed at the sides of the mounting surface 210, and the area of each corner terminal 251 is larger than the area of each side terminal 252. Accordingly, the solder H bonded to the corner terminal 251 at the time of mounting can be formed to be larger. Since the solder H is formed to be large, even if a crack or the like occurs in the solder H due to a thermal stress generated in the mounted state, the corner terminals 251 and the mounting substrate 9 are less likely to be opened. That is, it is possible to effectively prevent a conduction failure of the solder H. Therefore, a possibility of maintaining a good electrical coupling state between each corner terminal 251 and the mounting substrate 9 increases.

As described above, the mounting surface 210 includes, as sides, the first side 215, the second side 216 facing the first side 215, the third side 217, and the fourth side 218 facing the third side 217. The side terminal 252 is disposed along the first side 215 or the second side 216, and the length L1 of the corner terminal 251 along the third side 217 is larger than the length L2 of the side terminal 252 along the third side 217. Thus, by setting L1>L2, the area of the corner terminal 251 can be made larger than the area of the side terminal 252 with a simple configuration.

As described above, the length W1 of the corner terminal 251 along the first side 215 is larger than the length W2 of the side terminal 252 along the first side 215. Thus, by setting W1>W2, the area of the corner terminal 251 can be made larger than the area of the side terminal 252 with a simple configuration.

As described above, the circuit element 5 includes the active element formation region 510 in which the active element AC is formed, and the active element formation region 510 does not overlap the external terminal 25 in a plan view of the mounting surface 210. Accordingly, a thermal stress is less likely to be applied to the active element formation region 510 in the mounted state. Therefore, in an active element formed in the active element formation region 510, particularly in a transistor, variation in inter-electrode distance due to the thermal stress is effectively prevented, and an output change can be effectively prevented. Therefore, the vibrator device 1 has high reliability.

As described above, in the plan view of the mounting surface 210, at least a part of the region of the circuit element 5 that is not the active element formation region 510 overlaps the external terminal 25. Accordingly, a reduction in size of the vibrator device 1 can be achieved.

As described above, the vibration element is the angular velocity detection element 3 configured to detect an angular velocity. Accordingly, the vibrator device 1 can be used as an angular velocity sensor, and a high demand can be exhibited.

Although the vibrator device according to the disclosure has been described based on the illustrated embodiment, the disclosure is not limited thereto. The configuration of each unit can be replaced with any configuration having the same function. In addition, any other component or any other process may be added to the disclosure.

Although the vibrator device 1 is applied to an angular velocity sensor in the embodiment described above, the vibrator device 1 is not particularly limited. For example, the vibrator device 1 may be applied to an acceleration sensor using an acceleration detection element that is capable of detecting an acceleration as a vibration element. For example, the vibrator device 1 may be applied to an oscillator.

What is claimed is:

1. A vibrator device comprising:

three axes orthogonal to each other being defined as an X axis, a Y axis, and a Z axis;

a vibration element that is an angular velocity detection element, the vibration element being configured to detect an angular velocity;

a circuit element including;

a drive circuit configured to apply a drive signal to drive the angular velocity detection element; and a detection circuit configured to detect the angular velocity based on an output signal from the angular velocity detection element; and a package that accommodates the vibration element and the circuit element, the package being configured with a base and a lid, the base having a recess in which the vibration element and the circuit element are provided, wherein a bottom of the base of the package is a mounting surface having a rectangular shape in a plan view and a plurality of external terminals arranged at the mounting surface, the plurality of external terminals include a corner terminal disposed at a corner of the mounting surface and a side terminal disposed at a side of the mounting surface, an area of the corner terminal is larger than an area of the
side terminal,
an outer edge of each of the plurality of external terminals
is aligned with an outermost periphery of the base of
the package in the plan view,
the mounting surface includes:
  a first side and a second side that face each other and
    respectively extend along the X-axis in a plan view
    viewed along the Z axis; and
  a third side and a fourth side that face each other and
    respectively extend along the Y-axis in the plan view,
the side terminal includes a first side terminal arranged
  along the first side and a second side terminal arranged
  along the second side in the plan view, and
the corner terminal extends along the Y axis.
2. The vibrator device according to claim 1, wherein
a length along the Y-axis of the corner terminal is larger
  than a length along the Y-axis of the side terminal in the
  plan view.
3. The vibrator device according to claim 2, wherein
a length along the X-axis of the corner terminal is larger
  than a length along the X-axis of the side terminal in the
  plan view.

4. The vibrator device according to claim 1, wherein
the circuit element includes an active element formation
  region where an active element is formed, and
the active element formation region does not overlap the
  plurality of external terminals in the plan view.
5. The vibrator device according to claim 4, wherein
at least a part of a region of the circuit element that is not
  the active element formation region overlaps at least
  one of the plurality of external terminals in the plan
  view.
6. The vibrator device according to claim 1, wherein
a first length along the Y-axis of the corner terminal is
  longer than a second length along the X-axis of the
  corner terminal in the plan view.
7. The vibrator device according to claim 2, wherein
the length along the Y-axis of the corner terminal is longer
  than another length along the X-axis of the corner
  terminal in the plan view.
8. The vibrator device according to claim 3, wherein
another length along the Y-axis of the corner terminal is
  longer than the length along the X-axis of the corner
  terminal in the plan view.

* * * * *